(12) United States Patent
Gass et al.

(10) Patent No.: US 7,490,305 B2
(45) Date of Patent: Feb. 10, 2009

(54) METHOD FOR DRIVING VALUES TO DC ADJUSTED/UNTIMED NETS TO IDENTIFY TIMING PROBLEMS

(75) Inventors: Robert B. Gass, Pflugerville, TX (US); Yee Ja, Round Rock, TX (US); Christoph Jaeschke, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 11/457,865

(22) Filed: Jul. 17, 2006

(65) Prior Publication Data

US 2008/0016480 A1 Jan. 17, 2008

(51) Int. Cl.
*G06F 17/50* (2006.01)

(52) U.S. Cl. .................................. 716/4; 716/5; 716/6

(58) Field of Classification Search ................ 716/4–6
See application file for complete search history.

(56) References Cited

U.S. PATENT DOCUMENTS

| | | | |
|---|---|---|---|
| 4,011,465 A | 3/1977 | Alvarez, Jr. | |
| 5,287,289 A | 2/1994 | Kageyama et al. | |
| 5,396,435 A | 3/1995 | Ginetti | |
| 5,452,239 A | 9/1995 | Dai et al. | |
| 5,499,192 A | 3/1996 | Knapp et al. | |
| 5,504,690 A | 4/1996 | Kageyama et al. | |
| 5,586,047 A | 12/1996 | Imahashi | |
| 5,659,484 A | 8/1997 | Bennett et al. | |
| 5,958,077 A | 9/1999 | Banerjee et al. | |
| 5,966,523 A | 10/1999 | Uchino | |
| 6,056,784 A * | 5/2000 | Stanion | 716/5 |
| 6,071,003 A | 6/2000 | Ashuri et al. | |
| 6,321,184 B1 | 11/2001 | Baumgartner et al. | |
| 6,374,393 B1 | 4/2002 | Hirairi | |
| 6,516,449 B2 | 2/2003 | Masud | |

(Continued)

OTHER PUBLICATIONS

Xie et al., "Design of Robust-Path-Delay-Fault-Testable Combinational Circuits by Boolean Space Expansion", IEEE, International Conference on Computer Design: VLSI in Computers and Processors (ICCD '92), Oct. 11-14, 1992, pp. 482-485.

(Continued)

*Primary Examiner*—Jack Chiang
*Assistant Examiner*—Nghia M Doan
(74) *Attorney, Agent, or Firm*—Stephen R. Tkacs; Stephen J. Walder, Jr.; Casimer K. Salys (57) ABSTRACT

A method for driving values to "don't care" (DC) adjusted/untimed nets of an integrated circuit design to thereby identify timing problems are provided. The system and method may be utilized, for example, with logical built-in self test (LBIST) testing of an integrated circuit in which the DC adjusted (dcadj) nets for normal functional mode of the integrated circuit may not be DC adjusted for LBIST mode. By using the system and method, timing related problems associated with DC adjusted/untimed nets can be made apparent either by using simulation or semi-formal/formal analysis. For example, with regard to DC adjusted/untimed nets, the system and method may identify any violations of these nets with regard to maintaining their DC adjusted values. Such identification of violations of DC adjusted/untimed nets may be made without interfering with the static timing analysis of timed nets.

18 Claims, 4 Drawing Sheets

U.S. PATENT DOCUMENTS

| | | | |
|---|---|---|---|
| 6,553,514 B1 | 4/2003 | Baumgartner et al. | |
| 6,587,993 B2 * | 7/2003 | Shoyama | 716/3 |
| 6,643,829 B1 | 11/2003 | Borkovic et al. | |
| 6,643,832 B1 | 11/2003 | Ray et al. | |
| 6,816,825 B1 | 11/2004 | Ashar et al. | |
| 6,868,535 B1 | 3/2005 | Podkolzin et al. | |
| 6,959,271 B1 | 10/2005 | Ballam | |
| 6,973,632 B1 | 12/2005 | Brahme et al. | |
| 7,020,589 B1 | 3/2006 | Datta Ray et al. | |
| 7,086,016 B2 | 8/2006 | Matsuzaki et al. | |
| 7,194,715 B2 * | 3/2007 | Charlebois et al. | 716/6 |
| 7,240,311 B2 * | 7/2007 | Lai et al. | 716/5 |
| 2001/0020289 A1 | 9/2001 | Pavisic et al. | |
| 2004/0103387 A1 | 5/2004 | Teig et al. | |
| 2004/0233742 A1 | 11/2004 | Morzano | |
| 2004/0250226 A1 | 12/2004 | Lin et al. | |
| 2005/0246673 A1 | 11/2005 | Charlebois et al. | |
| 2005/0273748 A1 | 12/2005 | Hetzel et al. | |
| 2006/0095879 A1 | 5/2006 | Brahme et al. | |
| 2006/0190860 A1 | 8/2006 | Ng et al. | |
| 2007/0033551 A1 | 2/2007 | Greaves et al. | |

OTHER PUBLICATIONS

Miyamoto et al., "An Efficient Algorithm for Deriving Logic Functions of Asynchronous Circuits", Proceedings of Second International Symposium on Advanced Research in Asynchronous Circuits and Systems, Mar. 18-21, 1996, pp. 30-35.

Gharaybeh et al., "False-Path Removal Using Delay Fault Simulation", Proceedings of Seventh Asian Test Symposium, Dec. 2-4, 1998, pp. 82-87.

U.S. Appl. No. 11/360,906, filed Feb. 23, 2006, Hidvegi et al.

U.S. Appl. No. 11/054,903, filed Feb. 10, 2005, Ja et al.

* cited by examiner

METHOD FOR DRIVING VALUES TO DC ADJUSTED/UNTIMED NETS TO IDENTIFY TIMING PROBLEMS

BACKGROUND

1. Technical Field

The present application relates generally to an improved system and method for performing static analysis of integrated circuit designs. More specifically, the present application is directed to a system and method for driving values to so-called “don’t care” (DC) adjusted/untimed nets, or net segments, of an integrated circuit design to thereby identify timing problems.

2. Description of Related Art

In the field of integrated circuit (IC) design, digital electronic circuits are typically initially represented by a high-level abstraction written in a hardware description language (HDL). The HDL representation allows a circuit designer to express all the desired functionality of a digital electronic circuit at the register transfer level (RTL) of abstraction. The HDL representation is then converted into a circuit file through a process known as synthesis that involves translation and optimization. Finally, static timing analysis and formal verification, e.g., functional analysis, are performed on the circuit file. Static timing analysis verifies that the circuit design performs at target clock speeds. Formal verification ensures that the circuit file is functionally correct compared to the HDL. It should be noted that non-formal methods of verification may also be utilized.

Essentially, static timing analysis is used to verify that transitioning values from source latches to sink latches in the nets of the circuit design will satisfy the timing requirements of the synchronous logic. In order to simplify static timing analysis, circuit designers commonly identify and eliminate a selected set of non-critical timing paths throughout a circuit design when performing static timing analysis on the circuit design. Such set of non-critical timing paths are usually referred to as a snip, exception, or “don’t care” (DC) adjusted list or file (referred to hereafter as a DC adjusted (dcadj) list). The dcadj list enables the prevention of propagation of arrival times and required arrival times through pins, the changing of delays through pins, and the changing of the phases of arrival times propagating through pins, and other modifications of static timing constraints during static analysis. The dcadj list may be passed to the static timing tools to thereby identify to the static timing tools that certain nets, or net segments, need not adhere to static timing requirements since their value will not transition or change.

For most circuit designs, the practice of using dcadj lists is usually done to eliminate false timing violations during static timing analysis. That is, certain nets or net segments may be eliminated from static timing analysis because they do not need to adhere to timing requirements because their values are at a steady state. For example, signals which determine the mode of operation for some logic will only change during initialization. During normal operation, those signals are expected to never change. Hence they do not need to meet timing requirements.

A problem arises, however, in that a human designer decides on the dcadj list that is provided to the static timing tool. Thus, this designer may think the dcadj list is correct, however, they may fail to realize that some entries in the dcadj list will not be “don’t care” in certain modes of operation and should be removed from the dcadj list. It is also possible that the entry is in a form of a regular expression which inadvertently matches more points (nets or box/pin pairs) in the logic than intended.

As a result, when the critical timing paths of some circuit designs are masked as part of the cone of logic of the eliminated non-critical timing paths, i.e. the DC adjusted nets, the elimination of the non-critical timing paths may lead to a real timing violation not being detected during static timing analysis. For example, glitches in these DC adjusted (dcadj) nets may be missed if their source latches transition in value. This may be true even if the source latch transitions eventually result in the dcadj net holding its value. Such real timing violations may not even be realized until actual hardware is manufactured.

SUMMARY

The illustrative embodiments provide a system and method for driving values to “don’t care” (DC) adjusted/untimed nets of an integrated circuit design to thereby identify timing problems in these nets. The driving of values to DC adjusted/untimed nets is performed so as to verify that nets in the DC adjust/untimed net list are actually “don’t care” nets for all modes of operation of the integrated circuit device. In essence, the illustrative embodiments provide a mechanism for verifying a dcadj list.

The illustrative embodiments may be utilized, for example, with any mode of operation of an integrated circuit device in which DC adjusted nets may not be properly DC adjusted for that mode of operation. One such mode of operation is a logical built-in self test (LBIST) mode of operation of an integrated circuit in which the DC adjusted (dcadj) nets for normal functional mode of the integrated circuit may not be properly DC adjusted for LBIST mode, i.e. the dcadj nets have non-transitioning values during functional mode but have transitioning values during LBIST mode. By using the system and method according to the illustrative embodiments, timing related problems can be made apparent either by using semi-formal/formal or non-formal analysis.

With the system and method of the illustrative embodiments, a dcadj list is provided to static timing tools from which the dcadj nets or net segments may be identified and isolated in an integrated circuit design. The dcadj nets or net segments may be a single sink point of a multi-sink net, a single source of a multi-sourced net, or the like.

The dcadj nets or net segments are converted to single source/single sink nets. This conversion may be performed by using or inserting transparent latches, i.e. latches with no internal delay, having tied-up enable pins or buffers. The source latches which feed the dcadj nets are then identified and the paths between the source latches and the dcadj nets are logged. The paths from the source latches to their dcadj nets are duplicated. This duplicate path allows values to be driven from the source latches to the dcadj nets without interfering with timed nets, i.e. the nets that are not part of the dcadj list.

Then, as part of formal/semi-formal or non-formal analysis, an X value (i.e. an indeterminate value), or random value is then driven from the source latches along this duplicate net for a duration which would exceed the synchronous timing requirements. The X value is only driven when the source latch transitions. When a source latch does not transition in value, the source latch value is used.

The converted dcadj net is then checked to verify that the dcadj net always maintains its DC value. If driving an X value from the source latches, for example, an error can be detected when the dcadj net has an X value latched-in at the downstream logic. If driving with a random value, an error can be detected if the dcadj net acquires, however briefly, a different value than the one it is supposed to have.

From the check performed above, those dcadj nets in which a timing problem is present may be identified, i.e. those dcadj nets whose values transition may be identified. For these dcadj nets having timing problems, gating logic may be employed to prevent the transitioning dcadj net value from being experienced by downstream logic. If this is the case, then checks may be performed in the downstream logic in addition to, or instead of, the checks performed at the dcadj nets to verify that the downstream logic does not experience the transitioning dcadj net value. Thus, although a net should not be in the dcadj list, it may not really result in a problem with the functionality of the logic if gating logic is in place and downstream logic is unaffected by a transitioning dcadj net. In the physical hardware, this may not be a problem since the pathways which include the net which should not be in the dcadj list may all meet timing requirements.

In any case, whether gating logic exists or not, the net is not properly included in the dcadj list if the net can change in value. The mechanisms of the illustrative embodiments may identify such nets in the dcadj list and provide an indication of these nets to a designer so that the dcadj list may be modified to remove such nets. That is, based on the above checks, errors in maintaining the DC adjusted values of the dcadj nets may be identified and an appropriate output identifying these error nets may be provided to a user. The user may then modify the nets to alleviate the error. Alternatively, the removal of such nets from the dcadj list may be performed automatically based on results of the application of the mechanism of the illustrative embodiments. The above conversion, replication, and checking of the dcadj nets may be performed repeatedly on modified nets until no more errors in timing of the dcadj nets are identified, for example.

In one illustrative embodiment, a method is provided, in a data processing device, for verifying an operation of untimed net segments of an integrated circuit design. The method may comprise receiving the integrated circuit design, identifying at least one untimed net segment in the integrated circuit design, and driving a value along a pathway to the at least one untimed net segment. The method may further comprise collecting an output value from the untimed net segment and verifying an operation of the untimed net segment of the integrated circuit design based on the collected output value from the untimed net segment. The operation of the untimed net segment may be verified if the output value from the untimed net segment maintains a predetermined value, for example. The operation of the untimed net segment may be not verified if the output value from the untimed net segment achieves a value different from the predetermined value, for example. The method may output a result of the verification which identifies untimed net segments that are not verified as maintaining the predetermined value.

The method may further comprise replicating, in the integrated circuit design, a pathway to the untimed net segment. The driving of the value along a pathway to the at least one untimed net segment may comprise driving the value along the replicated pathway to the untimed net segment.

Identifying at least one untimed net segment in the integrated circuit design may comprise receiving a "don't care" (DC) adjusted list data structure that identifies net segments that do not need to adhere to timing requirements. The identifying may further comprise comparing entries in the DC adjusted list data structure to a netlist for the integrated circuit design and identifying at least one untimed net segment based on a match of a net segment in the DC adjusted list data structure with a net in the netlist for the integrated circuit design. The method may further comprise automatically modifying the DC adjusted list data structure based on results of the verification.

Driving a value along a pathway to the at least one untimed net segment may comprise driving one of an indeterminate value or a random value along the pathway to the at least one untimed net segment, and performing one of formal, semi-formal, or non-formal verification analysis on the integrated circuit design using the driven value. The verification analysis may use a logical built-in self test mode of operation of the integrated circuit device.

An indeterminate value may be driven along the pathway to the at least one untimed net segment. If the collected output value from the untimed net is an indeterminate value, the untimed net segment may be determined to be invalid.

In other illustrative embodiments, a computer program product comprising a computer useable medium having a computer readable program is provided. The computer readable program, when executed on a computing device, causes the computing device to perform various ones, and combinations of, the operations outlined above with regard to the method illustrative embodiment.

In yet another illustrative embodiment, an apparatus is provided that may comprise a processor and a memory coupled to the processor. The memory may comprise instructions which, when executed by the processor, cause the processor to perform various ones, and combinations of, the operations outlined above with regard to the method illustrative embodiment.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

The illustrative embodiments provide a mechanism for driving values to "don't care" (DC) adjusted/untimed nets in an integrated circuit design to thereby identify timing problems. The illustrative embodiments may be implemented in a single data processing system or may be distributed across a plurality of data processing systems that are coupled to one another via one or more communications networks. For example, a server computing device may provide a circuit model static timing analysis engine that may operate on circuit models provided by other computing devices, such as client computing device. A client computing device may communicate with the server computing device via one or more communications networks so as to control the application of static timing analysis, in accordance with the illustrative embodiments, to circuit models which may be provided initially as Hardware Description Language (HDL) files and converted to one or more netlist data structures, for example. Alternatively, the circuit models and static timing analysis engine may be provided entirely on the same computing device such that multiple computing devices and communication networks are not necessary. For purposes of the present description, however, it will be assumed that the illustrative embodiments are implemented in a distributed data processing system.

Figure 1:
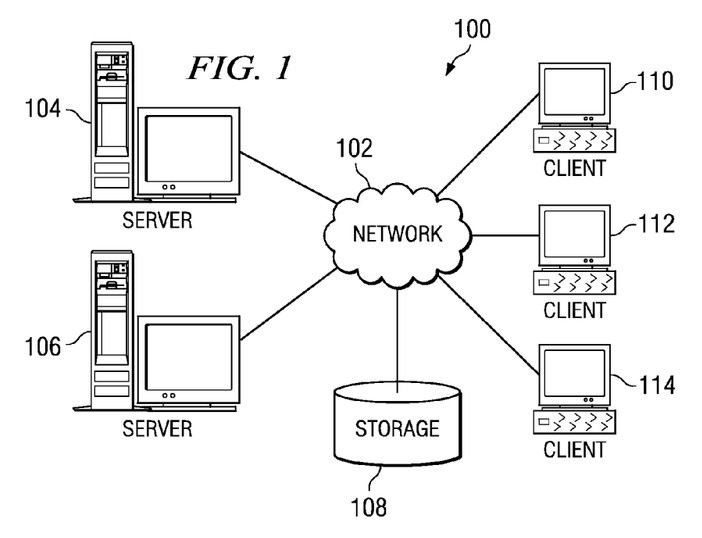
FIG. 1 is an exemplary block diagram of a distributed data processing system in which the illustrative embodiments may be implemented.
Figure 2:
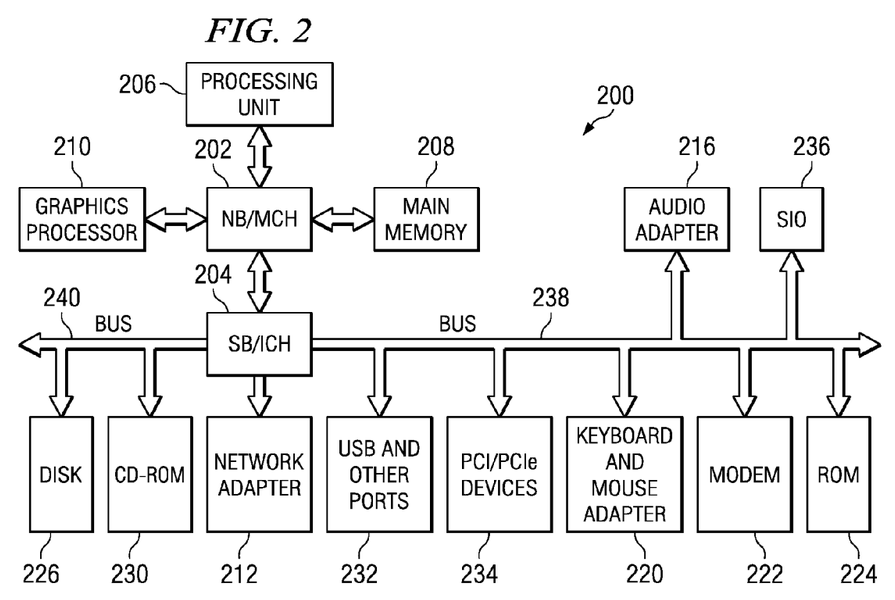
FIG. 2 is an exemplary block diagram of a computing system in which exemplary aspects of the illustrative embodiments may be implemented.

With reference now to the figures and in particular with reference to FIGS. 1-2, exemplary diagrams of data processing environments are provided in which embodiments of the present invention may be implemented. It should be appreciated that FIGS. 1-2 are only exemplary and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an exemplary distributed data processing system in which aspects of the illustrative embodiments may be implemented. Distributed data processing system 100 may include a network of computers in which embodiments of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an exemplary data processing system is shown in which aspects of the illustrative embodiments may be implemented. Data processing system 200 is an example of a computer, such as server 104 or client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ pSeries® computer system, running the Advanced Interactive Executive (AIX®) operating system or the LINUX® operating system (eServer, pSeries and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

The illustrative embodiments provide a system and method for driving values to DC adjusted/untimed nets to thereby identify timing problems, if any, in these DC adjusted/untimed nets. In this way, the mechanisms of the illustrative embodiments may be used to verify the dcadj list provided to static timing analysis tools by identifying those dcadj nets that should not be in the dcadj list, if any. An indication of such improperly included dcadj nets may be provided to a designer so that proper modification of the dcadj list and/or the integrated circuit design may be made. Moreover, the dcadj list may be automatically modified to not include such nets that are identified to have timing problems.

For example, with reference again to FIG. 1, the server 104 may provide a static timing analysis engine in accordance with the mechanisms of the illustrative embodiments. A client computing device, such as client 110, may provide a circuit model to the server 104 upon which the static timing analysis engine of server 104 is to operate in order to verify the design of the circuit. This circuit model may comprise, for example, a netlist data structure defining the various nets of the circuit model. The circuit model may further comprise a DC adjusted (dcadj) list data structure, which identifies those nets, or net segments, in the netlist data structure that are not required to adhere to the static timing requirements of the circuit model, i.e. those nets or net segments that are not timed in the static timing analysis. As is generally known in the art, such DC adjusted lists are typically provided as nets comprising points in the integrated circuit design that are designated as untimed or exceptions to timing requirements.

It should be appreciated that while the illustrative embodiments will be described with regard to nets in a netlist data structure, the present invention is not limited to use of a netlist data structure. Rather, other types of data structures that provide a logic description representative of a circuit design may be used without departing from the spirit and scope of the present invention.

The netlist and dcadj data structures may be input to the static timing analysis engine of the server 104 as the circuit model. The static timing analysis engine, based on the input data structures, identifies and isolates the dcadj nets or net segments from the other nets in the netlist data structure. In this way, two domains are established, a first "timed" domain consisting of the nets in the netlist data structure that are required to meet timing requirements of the integrated circuit design and a second "untimed" domain consisting of those nets in the netlist data structure that are not required to meet timing requirements, i.e. the DC adjusted/untimed nets identified in the dcadj data structure.

Having identified those nets in the netlist data structure corresponding to the nets or net segments identified in the dcadj data structure, the static timing analysis engine may then convert these identified dcadj nets or net segments into single source/single sink nets by using and/or inserting transparent latches with tied-up, i.e. tied-high, enable pins or buffers.

The static timing analysis engine then identifies the source latches that feed the dcadj nets and logs the paths between the source latches and the dcadj nets. Paths from the source latches to the dcadj nets are then duplicated by the static timing analysis engine to thereby provide redundant paths between the source latches and the dcadj nets. These redundant paths may then be used by the static timing analysis engine to drive an X value, i.e. an indeterminate value, or random value, as part of formal/semi-formal, or even non-formal verification methods, from the source latches for a duration which would exceed the synchronous timing requirements of the static timing analysis. The X value is only driven when the source latch transitions. When a source latch does not transition in value, the source latch value is used.

The duration in which an X or random value is driven depends on the maximum possible latency from a source sequential element to a sink sequential element through the untimed or adjusted net. Once that maximum latency period is met, the unaltered source latch value is used. For "don't care" nets in the dcadj list, one may be able to drive an X value indefinitely if the net is supposed to be truly untimed. For adjusted nets in the dcadj list, the duration of driving an X value should match the timing exception specified.

As stated above, the X value may be driven as part of formal/semi-formal, or non-formal verification methods. Non-formal verification methods may include, for example, simulation. Formal verification methods may include proof engines, for example. Semi-formal methods may use a combination of formal and non-formal verification methods. The mechanisms of the illustrative embodiments provide a way by which the logic of the dcadj nets may be modeled such that these types of verification methods may identify problems with the dcadj nets.

As part of the chosen verification method, a check of the dcadj nets, and/or any downstream logic, may be made by the static timing analysis engine to determine if the value at the dcadj nets or downstream logic is correct. For example, if an X value is driven from the source latches, an error may be detected when the dcadj net has an X value (since the X value is only driven when the source latch transitions). Moreover, if a random value is driven from the source latches, an error may be detected if the dcadj net acquires, however briefly, a different value than the one it is supposed to have.

The verification method may be provided with logic to recognize situations in which, even though a particular net should be excluded from the dcadj list because of a detected transition in its value, a real problem with the logic may not exist. If no logic makes use of the signal on the net, then the fault only really exist in the inclusion of the net in the dcadj list when it should not be, but the logic itself is not faulty. If a downstream latch captures the value derived from the net, then a inclusion of the net in the dcadj list is not only a problem with the dcadj list, but also is a problem in the logic. The verification method may be provided with logic for discerning these two different situations and thereby identify which nets in the dcadj list that have transitioning values which cause logic problems, thereby requiring a redesign of the circuit, and those that should merely be removed from the dcadj list.

The mechanisms of the illustrative embodiments may be used to perform static timing analysis in many different types of static timing analysis applications. In one illustrative embodiment, the mechanisms of the illustrative embodiment are used to verify that DC adjustments are being properly applied during different operating modes of an integrated circuit, such as DC adjustments to logic being applied in a functional mode of an integrated circuit device but not being valid in a logical built-in self test (LBIST) mode of operation of the integrated circuit device. Ideally, the DC adjustments should be applied to all modes of operation of an integrated circuit device. However, because the dcadj points of dcadj nets are user defined, and users are error prone, the inclusion of the dcadj, or untimed, nets in the dcadj list may be in error and thus, the DC adjustment may not generate an error in one mode of operation but may cause errors in the operation of the logic in other modes of operation.

LBIST mode of operation is used as an example in this disclosure to illustrate how, although DC adjusted, or untimed, nets may be valid in one mode of operation, they may not be for another. That is LBIST mode of operation is a good example where a net which is expected to be at a static value in normal functional mode, may be non-static in LBIST mode. In normal functional mode, the source latches to the untimed point may be fixed to some value so the DC adjusted, or untimed, net is added to the dcadj list. However, since LBIST scans in pseudo-random test patterns into the source latches of the DC adjusted net, the net may not be properly included in the dcadj list.

For example latch A in normal functional mode may always be a logical 0 and may be the input to a 2 input AND gate. The output of the AND gate may be the DC adjusted, or untimed, net in the dcadj list. If latch A receives a logical 1 value during LBIST mode of operation, then the untimed, i.e. DC adjusted, net may possibly need to be excluded from the dcadj list since its value may transition. However, it is possible that the logic may still operate properly if the other input to the AND gate is always a logical 0 when latch A has a logical 1 value. Such would be dependent on the valid LBIST patterns that are scanned-into the logic.

While LBIST is used herein as exemplary of a separate mode of operation from functional mode in which DC adjusted nets may not be properly DC adjusted, the illustrative embodiments are not limited to LBIST mode and functional mode. To the contrary, any modes of operation in which DC adjustments may be proper in one mode of operation and not proper in another mode of operation are intended to be within the spirit and scope of the present invention.

Figure 3:
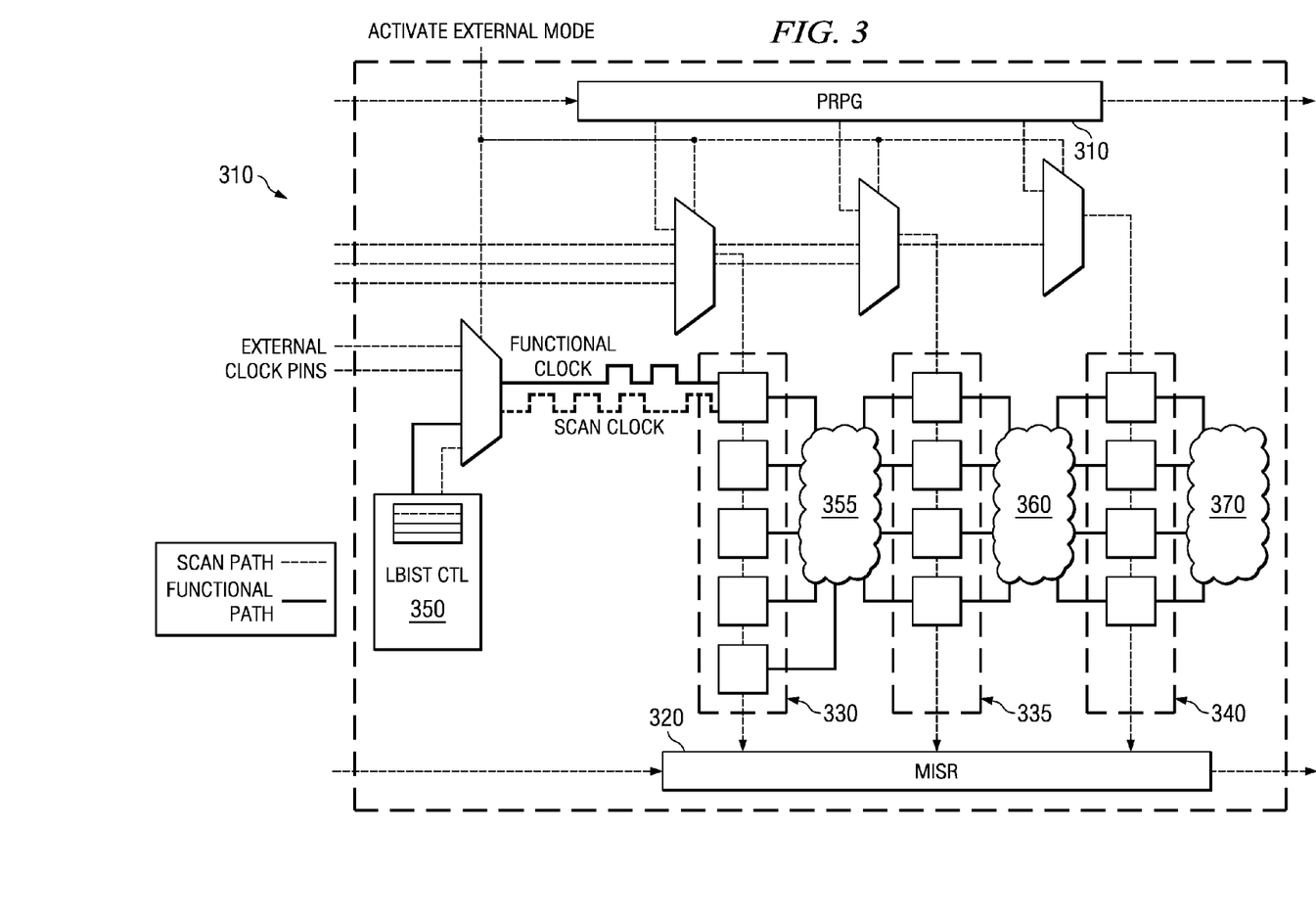
FIG. 3 illustrates an example of typical LBIST logic for an integrated circuit device.

FIG. 3 illustrates an example of typical LBIST logic for an integrated circuit device. As shown in FIG. 3, the basic idea of the LBIST techniques is to add a pseudorandom pattern generator (PRPG) 310 to the inputs of the integrated circuit device's internal scan chains 330-340 and to add a multiple-input signature register (MISR) 320 to the outputs of the integrated circuit device's internal scan chains 330-340. An LBIST controller 350 generates all necessary waveforms for repeatedly loading pseudorandom patterns into the scan chains 330-340, initiating a functional cycle (capture cycle, and logging the captured responses out into the MISR 320. The MISR compresses the accumulated responses into a code known as a signature.

In operation, the LBIST sequence used to apply test patterns is as follows. First, the PRPG 310 and MISR 320 are initialized to a predetermined state known as a seed. The circuitry then loops through a second and third step, as described hereafter, for n patterns. In the second step, scan clocks are applied to the PRPG 310, MISR 320, and system latches of scan chains 330-340 so that a pseudorandom pattern is generated by the PRPG 310 and loaded into the system latches of the scan chains 330-340. Simultaneously, the result of the previously applied test pattern is compressed from the system latches into the MISR 320. In a third step, the system clocks are applied to the system latches to test the logic paths 355-370 between the latches. Test patterns are both launched and captured by the latches in the scan chains 330-340.

After n repetitions of the second and third steps, the signature in the MISR 320 is compared against an expected predetermined signature that was calculated during the test-pattern generation and simulation process. Any corruption in the final signature at the end of the test indicates a defect in the integrated circuit device.

A problem may arise when performing LBIST testing of logic paths 355-370 wherein, during a functional mode of operation, logic elements in the logic paths 355-370 may be DC adjusted but should not be DC adjusted during an LBIST mode of operation, as illustrated by the previous example. In the LBIST mode of operation, the pattern being scanned in is known to generate a specific pattern that is scanned out. By driving either an X or random value through the DC adjusted or untimed nets, an incorrect value being scanned out means that the DC adjusted or untimed net may adversely affect the operation of the logic.

Figure 4:
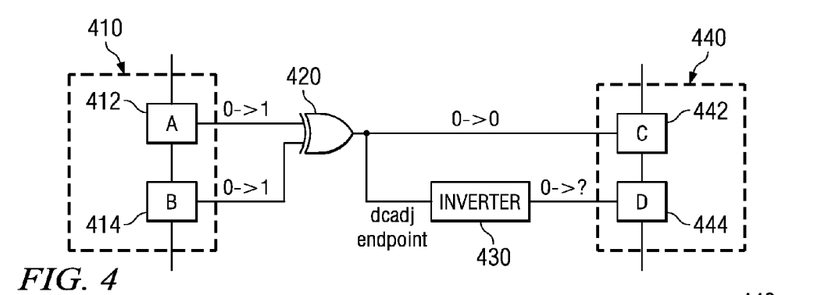
FIG. 4 illustrates the problem of treating DC adjusted/untimed nets during static timing analysis.

FIG. 4 illustrates this problem for a simple net. As shown in FIG. 4, a first scan chain 410 is comprised of scan latches A and B, denoted 412 and 414 which each transition from 0 to 1. The outputs of these scan latches 412 and 414 are inputs to an XOR gate 420 which provides an output to scan-out latch C, denoted 442, in a second scan chain 440. The output from the XOR gate 420 is further provided to a DC adjusted endpoint 430, which in this case is an inverter. The DC adjusted endpoint 430 is part of a DC adjusted/untimed net segment having a scan-out latch D, denoted 444, in the second scan chain 440.

In the depicted example, the input to the inverter 430 may be properly DC adjusted during functional mode, i.e. the static timing tool is informed that it does not need to validate timing for that net or that the net is an exception for timing.

However, in LBIST mode, such a DC adjustment may not be proper due to the logic of the net transitioning in value. For example, it is possible that if the output of scan latch A 412 and/or scan latch B 414 transitions, latch D 444 will not latch in the correct value. In the depicted example, both scan latch A 412 and scan latch B 414 have their outputs transition from 0 to 1. The statically timed paths (A to C and B to C) will not have late arrival times of the new value. However, A to D and B to D go through a DC adjusted, or untimed, net segment corresponding to inverter 430. Thus, the value latched by scan latch D 444 is unknown since it is not known whether the scan latch D 444 will properly latch in the transitioned value or the previous value due to the delay introduced by inverter 430.

The illustrative embodiments address such problems which may arise by identifying the DC adjusted/untimed nets or net segments and replicating the pathways to the DC adjusted/untimed nets or net segments such that indeterminate values (X values) or random values may be driven along these replicated pathways without adversely affecting logic pathways which do meet timing requirements, i.e. timed nets that are subject to standard static timing analysis. By driving the X value or random value along the replicated pathways of the DC adjusted/untimed nets during formal/semi-formal or non-formal analysis, the resulting value at the output latch may be investigated to determine if the DC adjusted net should not be properly included in the dcadj list and if an error in the circuit design along the DC adjusted/untimed nets is present.

Figure 5:
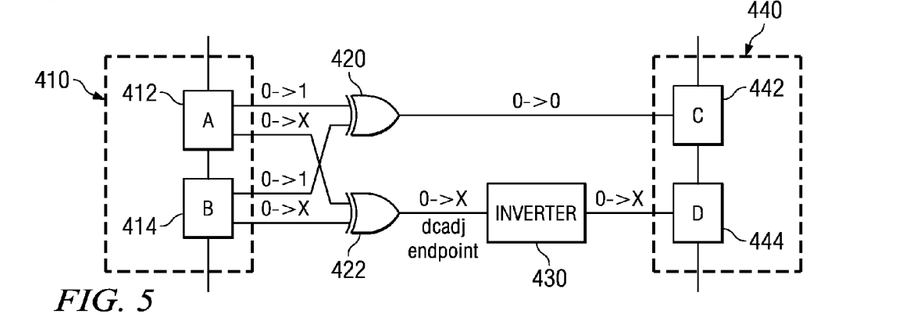
FIG. 5 is an exemplary diagram illustrating the exemplary net of FIG. 4 with the DC adjusted/untimed net having its associated pathways replicated in accordance with the illustrative embodiments.

FIG. 5 is an exemplary diagram illustrating the exemplary net of FIG. 4 with the DC adjusted/untimed net having its associated pathways replicated in accordance with the illustrative embodiments. As shown in FIG. 5, duplicate nets are provided between latches 412, 414 and the inverter 430. In addition, the logic gates along these duplicate nets, i.e. XOR gate 420, are replicated, resulting in duplicate XOR gate 422 in FIG. 5. By replicating these pathways, i.e. the gates and nets, to the DC adjusted endpoint, i.e. inverter 430, from the sources, i.e. latches 412 and 414, it is possible to drive these pathways with an indeterminate X value or random value without adversely affecting the logic pathways which meet static timing requirements. That is, a first set of pathways consisting of latch A 412, or latch B 414, XOR gate 420, and latch C 442, may be driven using the transitioning value of 0 to 1 of the latches 412 and 414 without adverse affects from a second set of pathways consisting of latch A, 412, or latch B 414, duplicate XOR gate 422, inverter 430, and latch D 444. Thus, normal static timing analysis may be performed on the first set of pathways and a separate analysis of DC adjusted/untimed nets in accordance with the illustrative embodiments may be performed on the second set of pathways.

In order to perform such replication of pathways, the DC adjusted/untimed nets or net segments of a circuit design need to first be identified and isolated from other nets and net segments in the netlist of the circuit design. This is done using a dcadj list data structure that is provided with the netlist as part of the circuit model. The DC adjusted nets or net segments may be identified as a single sink point of a multi-sink net, a single source of a multi-sourced net, or the like. By comparing the dcadj list data structure to the netlist data structure of the circuit design, the entries in the netlist data structure corresponding to the dcadj list data structure may be identified and a dcadj nets data structure may be generated. In this way, the nets or net segments of the circuit design are separated into a timed clock domain comprising all of the nets and net segments that are to satisfy timing requirements of synchronous logic, and an untimed clock domain comprising all of the nets and net segments corresponding to the DC adjusted/untimed nets or net segments (referred to as the dcadj nets or net segments).

The identified dcadj nets or net segments in the netlist data structure may then be converted to single source/single sink nets by using/inserting transparent latches, i.e. latches with no delay, with tied-high enable pins or buffers. For example, if the dcadj net is a multi-source/multi-sink net such that output pin of an AND gate is the point/net segment which is to be isolated, a new net is created as the output of the AND gate. The new net may provide an input into the transparent latch or buffer and the output of the transparent latch or buffer may be connected to the original AND gate output net. The new net is the single source/single sink net. The same can be done if a input into a sink pin needs to be isolated for the multi-source/multi-sink net.

The source latches which feed the dcadj nets are identified by looking at the netlist entries for these dcadj nets and determining the source specified in the netlist entry. As is generally known in the art, the netlist entry is comprised of a list of instances of elements for a particular net and the connections between these instances, which are typically defined in terms of the ports of the element instances that are connected to each other. By looking at the netlist entry, it can be determined which element instance is the source latch feeding a net, such as a dcadj net. Moreover, the pathways between element instances may be identified and logged by traversing the connectivity information of the netlist entry.

Having identified and logged the pathways between the source latches feeding the dcadj nets and the terminating latches or element instances of the dcadj nets, the pathways of the dcadj nets may then be replicated. The replication of pathways, i.e. the nets and logic, may be performed in a manner similar to that described in co-pending and commonly assigned U.S. patent application Ser. No. 11/054,903, entitled "System and Method for Unfolding/Replicating Logic Paths to Facilitate Propagation Delay Modeling," filed on Feb. 10, 2005, which is hereby incorporated by reference. As described in the co-pending U.S. Patent Application, unfolding/replication of pathways involves each path in an integrated circuit design that requires replication being identified and logged as discussed above. Then, for each path, a new endpoint net is generated, if it has not already been generated for a previous path. That is, since nets and logic in a particular path may be shared by other paths that are subject to replication, the endpoint for this path may have already been replicated when replicating a previous path. If so, then the already replicated endpoint is utilized during the replication process for this path. If not, then a new endpoint is generated in order to replicate this path.

A start point net is then generated. Thereafter, gates in the path are replicated. For each output of a replicated gate, if the sink of the original gate's output, i.e. the output of the gate that is being replicated, is the endpoint net for the original path, the replicated gate is connected to the new endpoint net. If a replicated sink gate for this path exists, i.e. has been generated during replication of another path, and if a replicated output net for this path exists, the output of the replicated gate is connected to the replicated output net. Otherwise, if a replicated sink gate for this path exists, and a replicated output net for this path does not exist, the output net of the original gate is replicated.

If the replicated sink gate for the path exists and a replicated output net for this path does not exist, then the replicated output net is tagged with lookup information, e.g., endpoint information and original net identification information. The output of each replicated gate is connected with this replicated output net and the input of the replicated sink gate is connected with this replicated output net.

Each newly created net is tagged with the endpoint information and the original net identification information. In this way, each replicated net is associated with an endpoint and the original net for which it is a replication. This association is used during a lookup of nets during the replication process to determine if a net already exists for the current replication process. Thus, for example, the "if" conditions described above that determine if a net already exists or not may be performed by using a lookup operation in a lookup table of replicated nets and gates, that may be indexed by endpoint and original net id information, to determine if a replicated net already exists.

Similarly, replicated gates are tagged, when created, with endpoint information and original gate identification information. This association may be made using the replicated net and gate lookup table described above, or a separate replicated gate lookup table, for example. The start point net generated by the process above is tagged with the endpoint information, original net identification information and a first gate identification. This first gate information is used to identify which gate the start point is to be connected to in the path.

A similar operation is performed for each input of the original gate that is being replicated. For each input of the original gate, and for each source of the input, if the source is the start point, the replicated gate is connected to the new start point net. For each input and source of the input, if a replicated source gate for this path already exists, i.e. from a previous replication process for example, and if a replicated input net for this path already exists, the input of the replicated gate is connected to the replicated input net. Otherwise, if a replicated input net for this path does not already exist, the input net of the original gate is replicated, each created net is tagged wit the endpoint information and original net identification information, the input of the replicated gate is connected with the replicated input net, and the output of the replicated source gate is connected with the replicated input net. If a replicated source gate for this path does not already exist, the original source is connected to the input of the replicated gate.

Thereafter, the endpoints are connected with the new endpoint nets, and the new start points are connected with the start point drivers. In this way, the original logic is unfolded by replicating nets and logic such that each net may be individually driven. For more detailed information regarding the above unfolding/replication process, reference is made to the co-pending and commonly assigned U.S. patent application Ser. No. 11/054,903.

After having unfolded and replicated the necessary nets, i.e. the DC adjusted/untimed nets, indeterminate or random values may be driven from a source of the replicated nets through the replicated nets to a terminating latch. The driving of an indeterminate or random value may be performed using any randomizer logic or simulator driven "X" value that allows multi-value representations. For example, the driving of the indeterminate or random value may be performed using one or more of the circuits described in commonly assigned and co-pending U.S. patent application Ser. No. 11/360,906, entitled "Modeling Asynchronous Behavior from Primary Inputs and Latches," filed on Feb. 23, 2006, which is hereby incorporated by reference.

By driving the indeterminate/random value, output values are latched into output latches of the DC adjusted/untimed nets. These output values may be output from the output latches, e.g., latch D 444, and recorded for use by the static timing analysis mechanisms to analyze the operation of the circuit design. For example, the replicated DC adjusted nets may be checked to determine whether the DC adjusted nets maintain their DC value. For example, if driving an indeterminate "X" value from the source of the DC adjusted net, an error is determined to be present in the DC adjusted net if the output value of the DC adjusted net has an X value. If driving with a random value, an error can be detected if the DC adjusted net acquires, however briefly, a different value than the one it is supposed to have, e.g., a glitch. From the resulting output, a user may be informed of which DC adjusted/untimed nets should not be included in the dcadj list because they transition in value.

Moreover, the static timing analysis mechanism may investigate the downstream logic of the identified DC adjusted/untimed nets having timing problems to determine if the timing problems affect the values seen by the downstream logic. If the downstream logic does not use the value of the DC adjusted/untimed nets, then the DC adjusted/untimed nets need only be removed from the dcadj list. However, if the downstream logic does utilize the value of the DC adjusted/untimed nets, e.g., the operation of the downstream logic is based on the value of the DC adjusted/untimed nets, then a correction of the circuit design may be in order. Both situations may be notified to a designer for each DC adjusted/untimed net that is identified as having a timing problem using the mechanisms of the illustrative embodiments. For those DC adjusted/untimed nets that are identified as needing only to be removed from the dcadj list, an automated mechanism may be provided for modifying the dcadj list to remove these nets.

Figure 6:
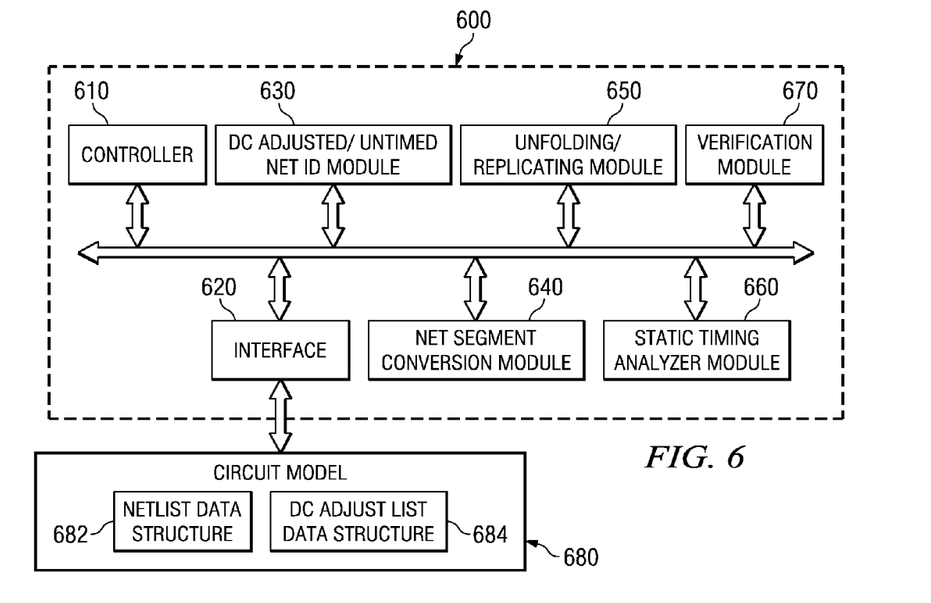
FIG. 6 is an exemplary block diagram illustrating the primary operational elements of a static timing analysis engine in accordance with one illustrative embodiment.

FIG. 6 is an exemplary block diagram illustrating the primary operational elements of a static timing analysis engine in accordance with one illustrative embodiment. As shown in FIG. 6, the static analysis engine 600 includes a controller 610, an interface 620, a DC adjusted/untimed net identification module 630, a net segment conversion module 640, an unfolding/replicating module 650, a static timing analyzer module 660, and a verification module 670. The elements 610-670 of the static analysis engine 600 may be implemented in either hardware, software, or any combination of hardware and software. In one illustrative embodiment, the elements 610-670 are implemented as software instructions executed by one or more processors.

The controller 610 controls the overall operation of the static analysis engine 600 and orchestrates the operation of the other elements 620-670. The controller 610 receives a circuit model 680, including, for example, a netlist data structure 682 and dcadj list data structure 684, via the interface 620 which may be a user interface, a network interface, and/or the like. The controller 610 provides the netlist data structure 682 and dcadj list data structure 684 to the DC adjusted/untimed net identification module 630 which operates on these data structures to identify and isolate the dcadj nets or net segments in the netlist data structure 682. The controller 610 provides the resulting identified and isolated dcadj nets or net segments to the net segment conversion module 640 which converts the net segments to single source/single sink nets by using/inserting transparent latches with tied-high enable pings or buffers.

The controller 610 provides the converted nets to the unfolding/replicating module 650 which identifies the source latches which feed the dcadj nets and logs the paths between them. The unfolding/replicating module 650 then unfolds and replicates the paths from the source latches to the dcadj nets, such as described in commonly assigned and co-pending U.S. patent application Ser. No. 11/054,903. The result of the unfolding/replicating of paths may be a modified netlist data structure in which additional duplicative nets are provided in the netlist for driving of indeterminate/random values along the duplicate nets during static timing analysis.

The static timing analyzer module 660 then performs static timing analysis on the modified netlist data structure. As part of this static timing analysis, indeterminate/random values are driven along the duplicative nets in the netlist data structure. The results of this static timing analysis are recorded for later use in verifying the correct operation of the circuit model.

The controller 610 provides the output values from the static timing analysis performed by the static timing analyzer module 660 to the verification module 670. The verification module 670 analyzes the output values to determine if each of the timed nets in the modified netlist data structure are meeting timing requirements and each of the DC adjusted/untimed nets maintain their DC adjusted values. Any timed nets that do not meet timing requirements or DC adjusted/untimed nets that do not maintain their DC adjusted values, may be logged and a notification of these violations may be provided to a user. The user may then take steps to modify the dcadj list data structure 684 and/or the circuit model to correct these violations.

As mentioned above, not all violations will result in errors in the operation of the logic, depending upon whether the downstream logic utilizes the values output by the DC adjusted/untimed nets. Thus, the circuit model need not be corrected in all instances. For those instances where the DC adjusted/untimed nets that generate violations do not affect the operation of the downstream logic, these nets may be simply removed from the dcadj list data structure 684. An automated mechanism in the verification module 670 may be provided for automatically removing such nets from the dcadj list data structure 684 to provide an updated dcadj list data structure 684.

Figure 7:
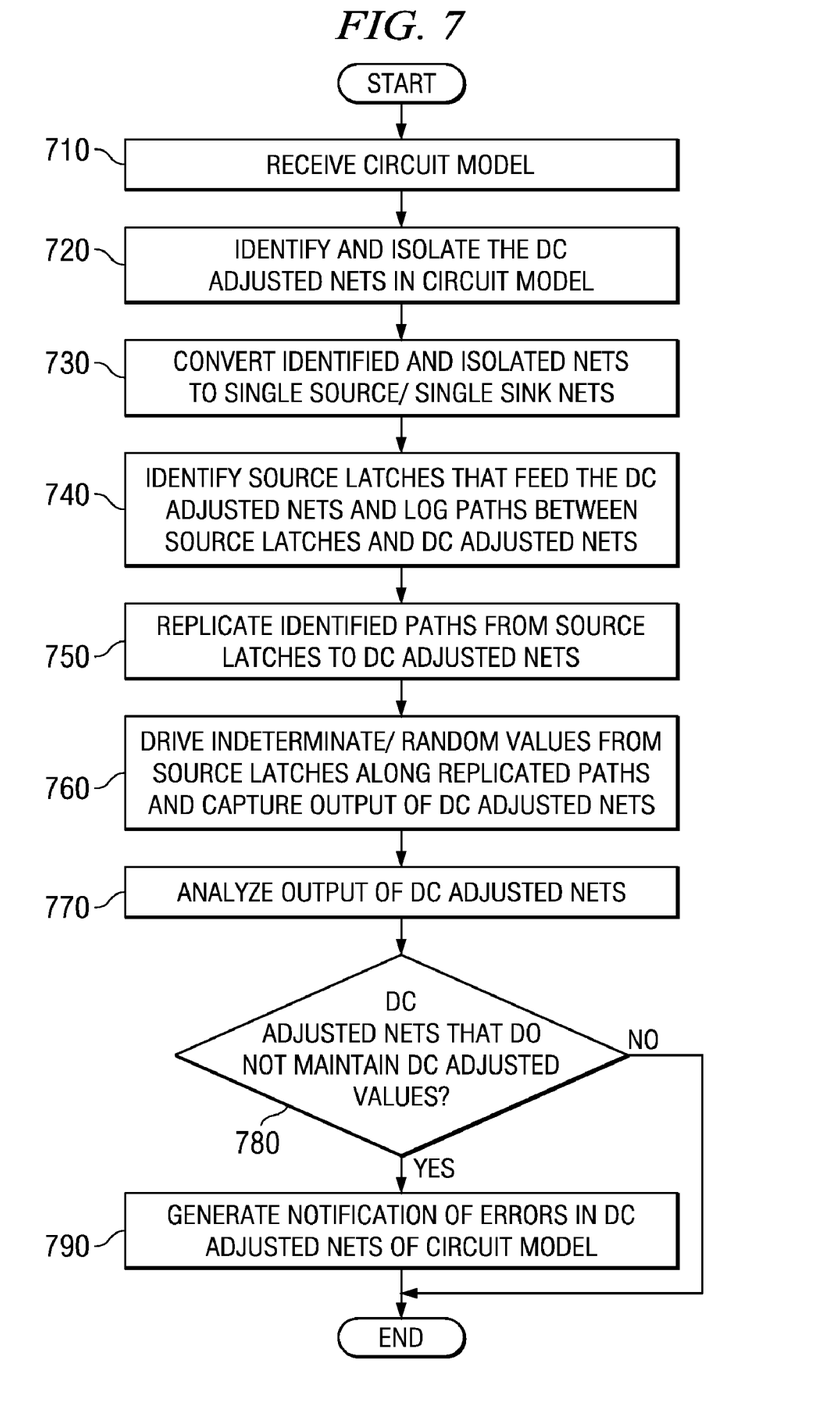
FIG. 7 is a flowchart outlining an exemplary operation for driving values to DC adjusted/untimed nets to identify timing problems in accordance with one illustrative embodiment.

FIG. 7 is a flowchart outlining an exemplary operation for driving values to DC adjusted/untimed nets to identify timing problems in accordance with one illustrative embodiment. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 7, the operation starts with the static timing analysis engine receiving a circuit model including a netlist data structure, a dcadj list data structure, or the like (step 710). The static timing analysis engine identifies and isolates the dcadj nets or net segments in the netlist data structure based on the dcadj list data structure (step 720). The static timing analysis engine converts the identified and isolated net segments into single source/single sink nets by using/inserting transparent latches with tied-high enable pins or buffers (step 730). The static timing analysis engine identifies the source latches which fed the dcadj nets or net segments and log the paths between the source latches and the dcadj nets or net segments (step 740).

The static timing analysis engine replicates the identified paths from the source latches to the dcadj nets or net segments (step 750). The static timing analysis engine drives indeterminate/random values from the source latches and captures the output of the dcadj nets or net segments (step 760). The static timing analysis engine analyzes the output of the dcadj nets or net segments (step 770). The static timing analysis engine determines if there are any dcadj nets that do not maintain their DC adjusted values (step 780). If so, the static timing analysis engine generates a notification of the nets that do not maintain their DC adjusted values (step 790). The operation then terminates.

Thus, with the illustrative embodiments, a system and method for driving values to "don't care" (DC) adjusted/untimed nets of an integrated circuit design to thereby identify timing problems are provided. The illustrative embodiments may be utilized, for example, with logical built-in self test (LBIST) testing of an integrated circuit in which the DC adjusted (dcadj) nets for normal functional mode of the integrated circuit may not be DC adjusted for LBIST mode. By using the system and method according to the illustrative embodiments, timing related problems can be made apparent either by using non-formal or semi-formal/formal analysis. For example, with regard to DC adjusted/untimed nets, the illustrative embodiments identify any violations of these nets with regard to maintaining their DC adjusted values. Such identification of violations of DC adjusted/untimed nets may be made without interfering with the static timing analysis of timed nets.

It should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software, which includes but is not limited to firmware, resident software, microcode, etc.

Furthermore, the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing device, for verifying an operation of untimed net segments of an integrated circuit design, comprising:
   receiving the integrated circuit design;
   receiving a "don't care" (DC) adjusted list that identifies net segments that do not need to adhere to timing requirements;
   comparing entries in the DC adjusted list to a netlist for the integrated circuit design to identify an untimed net segment based on a match of a net segment in the DC adjusted list with a net in the netlist for the integrated circuit design;
   driving a value along a pathway to the at least one untimed net segment;
   monitoring an output state value from the untimed net segment;
   verifying an operation of the untimed net segment of the integrated circuit design based on the collected output value from the untimed net segment;
   determining whether there is a violation in the operation of the untimed net segment;
   determining whether downstream logic in the integrated circuit design uses the output value; and
   removing the untimed net segment from the DC adjusted list if there is a violation in the operation of the untimed net segment and downstream logic in the integrated circuit design does not use the output value.

2. The method of claim 1, wherein the operation of the untimed net segment is verified if the output value from the untimed net segment maintains a predetermined value.

3. The method of claim 1, wherein the operation of the untimed net segment is not verified if the output value from the untimed net segment achieves a value different from a predetermined value.

4. The method of claim 3, further comprising:
   outputting a result of the verification, wherein the result identifies untimed net segments that are not verified as maintaining the predetermined value.

5. The method of claim 1, further comprising:
   replicating, in the integrated circuit design, a pathway to the untimed net segment, wherein driving the value along a pathway to the at least one untimed net segment comprises driving the value along the replicated pathway to the untimed net segment.

6. The method of claim 1, wherein driving a value along a pathway to the at least one untimed net segment comprises:
   driving one of an indeterminate value or a random value along the pathway to the at least one untimed net segment; and
   performing one of formal, semi-formal, or non-formal verification analysis on the integrated circuit design using the driven value.

7. The method of claim 6, wherein the verification analysis uses a logical built-in self test mode of operation of the integrated circuit device.

8. The method of claim 1, wherein an indeterminate value is driven along the pathway to the at least one untimed net segment, and wherein if the collected output value from the untimed net is an indeterminate value, the untimed net segment is determined to be invalid.

9. The method of claim 1, further comprising:
   responsive to there being a violation in the operation of the untimed net segment and downstream logic in the integrated circuit design using the output value, notifying a designer that the untimed net segment has a timing error.

10. The method of claim 9, further comprising:
    responsive to there being a violation in the operation of the untimed net segment and downstream logic in the integrated circuit design using the output value, notifying a designer that the untimed net segment has a timing error.

11. A method, in a data processing device, for verifying an operation of untimed net segments of an integrated circuit design, comprising:
    receiving the integrated circuit design;
    receiving a "don't care" (DC) adjusted list that identifies net segments that do not need to adhere to timing requirements;
    comparing entries in the DC adjusted list to a netlist for the integrated circuit design to identify an untimed net segment based on a match of a net segment in the DC adjusted list with a net in the netlist for the integrated circuit design;
    converting the untimed net segment to single source and single sink net;
    identifying a source latch that feeds the untimed net segment;
    identifying, in the integrated circuit design, a path to the untimed net segment from its source latch;
    replicating, in the integrated circuit design, the identified path to form a replicated path;
    driving a value to the untimed net segment along the identified path and the replicated path;
    monitoring an output state value from the untimed net segment; and
    verifying an operation of the untimed net segment of the integrated circuit design based on the collected output value from the untimed net segment;
    determining whether there is a violation in the operation of the untimed net segment;
    determining whether downstream logic in the integrated circuit design uses the output value; and
    removing the untimed net segment from the DC adjusted list if there is a violation in the operation of the untimed net segment and downstream logic in the integrated circuit design does not use the output value.

12. The method of claim 11, wherein the operation of the untimed net segment is verified if the output value from the untimed net segment maintains a predetermined value.

13. The method of claim 11, wherein the operation of the untimed net segment is not verified if the output value from the untimed net segment achieves a value different from a predetermined value.

14. The method of claim 13, further comprising:

outputting a result of the verification, wherein the result identifies untimed net segments that are not verified as maintaining the predetermined value.

15. The method of claim 11, wherein driving a value to the at least one untimed net segment comprises:

driving one of an indeterminate value or a random value to the at least one untimed net segment; and performing one of formal, semi-formal, or non-formal verification analysis on the integrated circuit design using the driven value.

16. The method of claim 15, wherein the verification analysis uses a logical built-in self test mode of operation of the integrated circuit device.

17. The method of claim 11, wherein an indeterminate value is driven to the at least one untimed net segment, and wherein if the collected output value from the untimed net is an indeterminate value, the untimed net segment is determined to be invalid.

18. The method of claim 11, wherein converting the untimed net segment to single source and single sink net comprises inserting at least one transparent latch into the integrated circuit design.

* * * * *